United States Patent [19]

Vasudev

[11] 4,439,910
[45] Apr. 3, 1984

[54] PROCESS FOR FABRICATION OF MONOLITHIC TRANSISTOR COUPLED ELECTROLUMINESCENT DIODE

[75] Inventor: Prahalad K. Vasudev, Santa Monica, Calif.

[73] Assignee: Hughes Aircraft Company, El Segundo, Calif.

[21] Appl. No.: 470,101

[22] Filed: May 20, 1982

Related U.S. Application Data

[62] Division of Ser. No. 191,558, Sep. 29, 1980, Pat. No. 4,388,633.

[51] Int. Cl.$^3$ ............................................. H01L 21/20
[52] U.S. Cl. ............................ 29/569 L; 29/576 E; 29/572; 29/591; 148/171; 148/175
[58] Field of Search ............ 29/569 L, 576 E, 576 J, 29/572, 591; 148/171, 175; 372/5

[56] References Cited

U.S. PATENT DOCUMENTS

| | | | |
|---|---|---|---|
| 2,569,347 | 9/1951 | Schockley | 148/33 X |
| 4,136,928 | 1/1979 | Logan et al. | 29/569 L |
| 4,137,107 | 1/1979 | Nijman et al. | 148/175 X |
| 4,233,090 | 11/1980 | Hawrylo et al. | 148/171 |
| 4,249,967 | 2/1981 | Liu et al. | 148/172 X |
| 4,269,635 | 5/1981 | Logan et al. | 148/171 |
| 4,388,633 | 6/1983 | Vasudev | 357/17 |

FOREIGN PATENT DOCUMENTS 57-28375  2/1982  Japan ................................. 29/569 L

OTHER PUBLICATIONS

Katz et al., *Appli. Phys. Lett.*, vol. 37(2), Jul. 15, 1980, pp. 211–213.

Konogai et al., *J. of Applied Physics*, vol. 48, No. 10, Oct. 1977, pp. 4389–4394.

*Primary Examiner*—G. Ozaki
*Attorney, Agent, or Firm*—David W. Collins; W. J. Bethurum; A. W. Karambelas

[57] ABSTRACT

Modulated signal levels in the range of 1 $\mu$V, as is typical for radar returns, can be used to achieve a useful modulated optical signal that can be launched into a fiber optic waveguide for transmission to a remote location for signal processing. The device of the invention achieves such a conversion by suitably integrating a high gain bipolar transistor with an electroluminescent diode, such as a light emitting diode or diode laser, into a compact monolithic structure.

In one structural configuration, the bipolar transistor comprises an emitter comprising a layer of doped n-(Al,Ga)As supported on a base comprising a layer of doped p-GaAs, in turn supported on a collector comprising a layer of undoped n-GaAs or n-(Al,Ga)As. The electroluminescent diode in this embodiment comprises a light-emitting diode formed by a p-n junction between the undoped n-GaAs or n-(Al,Ga)As layer and a supporting doped p-GaAs layer, in turn supported on a doped p$^+$-GaAs substrate. Collector contact is made to the backside of the substrate.

An electrical signal at the base is amplified by transistor action, resulting in a high gain optical output by the LED, which may be launched into an optical fiber in either a Burrus or edge-emitting configuration. Direct optical amplification of optical radiation may be made by omitting electrical contact to the base and introducing the optical radiation into the emitter.

9 Claims, 6 Drawing Figures

4,439,910

PROCESS FOR FABRICATION OF MONOLITHIC TRANSISTOR COUPLED ELECTROLUMINESCENT DIODE

This is a division of application Ser. No. 191,558, filed Sept. 29, 1980, now U.S. Pat. No. 4,388,633.

BACKGROUND OF THE INVENTION

1. Field of the Invention

This invention relates to means for amplifying an optical signal, and, in particular, to a device comprising a high gain compound semiconductor heterojunction bipolar transistor operated in a common emitter configuration coupled to a light-emitting device in a monolithic structure.

2. Description of the Prior Art

At present, low level signals are typically preamplified by several stages of silicon transistors and then used to drive a light-emitting diode (LED) or diode laser for launching optical radiation into a fiber optic waveguide. Silicon current amplifiers are disclosed in, e.g., U.S. Pat. No. 2,569,347.

A bipolar heterojunction phototransister capable of current gains of up to 1600 has been disclosed in Vol. 48(10), Journal of Applied Physics, pp. 4389-4394 (1977). The device comprises undoped n-type GaAs (collector), p-type GaAs (base) and n-type $Ga_{1-x}Al_xAs$ (emitter), operated in common emitter fashion.

Monolithic integration of GaAs/GaAlAs bipolar transistor and heterostructure laser is disclosed in Vol. 37(2), Applied Physics Letters, pp. 211-213 (1980). Current gains of up to 900 are realized.

SUMMARY OF THE INVENTION

In accordance with the invention, an optical radiation amplifier is provided including:

(a) a bipolar transistor having base, emitter and collector regions connected in common emitter configuration; and (b) a light emitting device having regions of opposite conductivity forming a p-n junction, said light emitting device connected to said collector in a monolithic fashion.

The monolithic device employs a structure which comprises:

(a) a highly doped substrate of a compound semiconductor material having a first conductivity;

(b) a first epitaxial layer of a compound semiconductor material formed on at least a portion of said substrate and having the same conductivity;

(c) a second epitaxial layer of a compound semiconductor material formed on at least a portion of said first epitaxial layer and having a conductivity opposite to that of said first layer, said second layer being essentially undoped;

(d) a third epitaxial layer of a compound semiconductor material formed on at least a portion of said second layer and having a conductivity opposite to that of said second layer, said third layer having a thickness sufficient to provide the device with a high current gain;

(e) means for making ohmic contact to said third layer;

(f) a fourth epitaxial layer of a mixed compound semiconductor material formed on a portion of said third layer and having a conductivity opposite to that of said third layer;

(g) means for making ohmic contact to said fourth layer; and (h) means for making ohmic contact to said substrate.

Optical radiation (light) output is obtained from the p-n junction formed by the first and second layers, employing either a conventional Burrus structure with the fiber optic waveguide inserted in the substrate or an edge-emitting configuration.

The first and second layers comprise a LED, while the second, third and fourth layers comprise a bipolar junction transistor comprising a collector, base and emitter, respectively. The emitter contact is made to the fourth layer, the base contact is made to the third layer and the collector contact is made to the second layer through the substrate and first layer.

The foregoing device permits amplification of an electrical signal to drive a light emitting device, which may comprise a LED or diode laser. Current gains of up to 2,000 to 2,500 are achievable with the device of the invention. Direct amplification of an optical signal may be made by omitting electrical contact to the base and introducing the optical signal into the fourth layer (the emitter), with light output as above.

The present invention accomplishes both the preamplification and driving a light-emitting device in a compact monolithic structure that consumes substantially less total drive power without sacrificing the frequency response of the device.

DETAILED DESCRIPTION OF THE INVENTION

Modulated signal levels in the range of 1 $\mu V$, as is typical for radar returns, can be used to achieve a useful modulated optical signal that can be launched into a fiber optic waveguide for transmission to a remote location for signal processing. The device of the invention achieves such a conversion by suitably integrating a high gain bipolar transistor with an electroluminescent diode into a compact monolithic structure. The device of the invention achieves in a very simple, efficient and economical way what is currently done by modulating a GaAs diode laser or light emitting diode (LED) that has been prebiased to threshold. In the device of the invention, the amplifier is integrated with the LED into a planar monolithic structure that is much simpler to fabricate than a single laser. The amplification is provided internally by the bipolar transistor, with current gains far exceeding those currently achievable with state-of-the-art silicon transistors. In addition, the much simpler circuitry required for device operation minimizes both the power dissipation and parasitic elements, thereby improving the bandwidth performance.

The device of the invention comprises a high gain mixed compound semiconductor heterojunction bipolar transistor operated in a common emitter configuration coupled to a compound semiconductor light emitting device, such as a LED or diode laser, through the collector in a monolithic fashion. For a low level signal fed into the base, the amplified collector current drawn from the transistor forward-biases the light emitting device, causing light emission from either the edge or surface. The basic structure and its circuit equivalent are depicted in FIGS. 1 and 2.

The description that follows is given in terms employing GaAs as the compound semiconductor material and (Al,Ga)As as the mixed compound semiconductor material. Such a device emits electromagnetic radiation at 0.93 μm. Other III-V compound semiconductor materials may also be suitably employed. For example, the compound semiconductor material may comprise InP and the mixed compound semiconductor material (In,Ga) (As,P). As used herein, optical radiation (light) includes that part of the electromagnetic spectrum encompassing visible and near-IR.

The difference between the bandgap of the compound semiconductor and that of the mixed compound semiconductor employed as the emitter of the transistor should be at least about 0.5 eV, in order to provide superinjection of the majority carrier, which is essential for obtaining high gain in the bipolar transistor. For example, the bandgap for GaAs is 1.4 eV, while the bandgap for $Al_xGa_{1-x}As$ is 2.2 eV for values of x greater than about 0.5, resulting in a bandgap difference of 0.8 eV. For the InP/(In,Ga) (As,P) system, the bandgap difference is about 0.6 eV.

Figure 1:
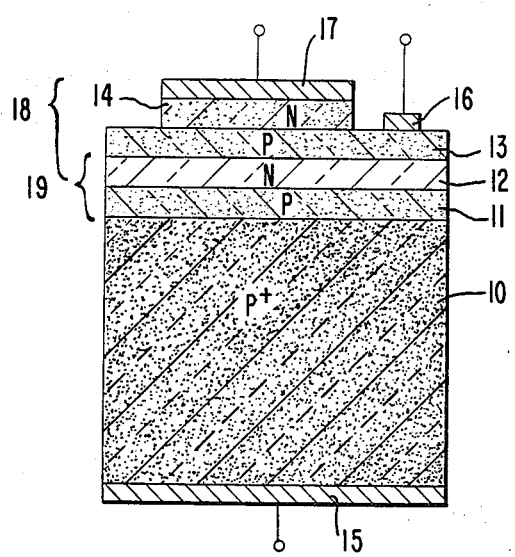
FIG. 1 is a cross-sectional view of a device in accordance with the invention.
Figure 2:
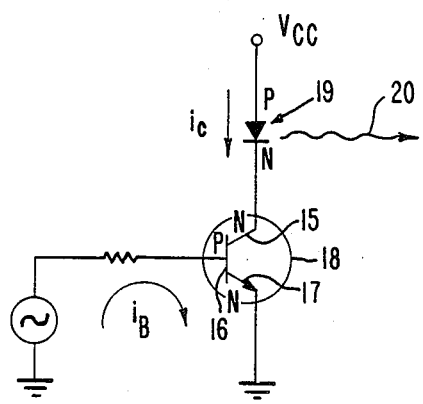
FIG. 2 is an equivalent circuit of FIG. 1.

FIG. 1 depicts a substrate 10 of $p^+$-GaAs, preferably doped to greater than about $10^{18}$ cm$^{-3}$. On one surface of the substrate, a succession of layers 11, 12, 13 and 14 are grown. These layers, discussed in further detail below, are epitaxially formed by methods well-known in the art, such as by liquid phase epitaxy (LPE) or vapor phase epitaxy (VPE). The growth conditions for forming such layers and for introducing dopant materials as required are well-known in the prior art and do not form a part of this invention.

Layer 11 has the same composition as the substrate and is of the same conductivity (here, p-type), preferably doped to a carrier concentration of about $1 \times 10^{18}$ cm$^{-3}$.

Layer 12 may be of the same composition as layer 11. However, if the device is driven at high currents (e.g., greater than about 10 mA), then it may oscillate due to a feedback mechanism inherent in the four layer structure. Accordingly, it may be desirable to employ a mixed compound semiconductor, e.g., $Al_xGa_{1-x}As$, in place of GaAs to suppress the feedback-induced oscillation. The value of x ranges from about 0.6 to 0.9. Below a value of about 0.6, oscillation is not sufficiently reduced to warrant growth of the mixed compound semiconductor layer, while above a value of 0.9, growth of subsequent layer 13 is difficult. Layer 12 is undoped and is of n-type conductivity, opposite to that of layer 11.

Layer 13 is of the same composition and conductivity as layer 11, being doped with a p-dopant, preferably germanium, to a carrier concentration of about $1 \times 10^{18}$ cm$^{-3}$.

Layer 14 comprises a mixed compound semiconductor, here $Al_yGa_{1-y}As$, doped with an n-dopant, preferably tin or tellurium, to a carrier concentration of about $1 \times 10^{17}$ cm$^{-3}$. The value of y in the mixed compound semiconductor employed as the emitter of the transistor must be sufficiently high so that the material has a bandgap in the indirect region. This provides discontinuity in the valence band, which is essential for promoting superinjection and consequently high current gains in the bipolar transistor. For $Al_yGa_{1-y}As$, y ranges from about 0.3 to 0.9; values of y less than about 0.3 provides a direct bandgap material, while values of y greater than about 0.9 are difficult to make ohmic contact to.

The doping levels described above for the GaAs/(Al,Ga)As device depicted in FIG. 1 are within ±10% and are optimized for high gain and high light output for this device. Outside the range of doping levels given, the resistance of each layer is considered to be too high for optimum performance. For other compound semiconductor devices, the compositions would be different, depending on the amount of superinjection achievable in a particular system, but are easily determined by simple experimentation such as Auger and X-ray spectroscopy of the grown epitaxial films.

The thickness of the substrate 10 is not critical other than it be thick enough to provide adequate support for the device, but not so thick as to interfere with device operation. Typical values range from about 100 to 250 μm.

The thicknesses of layers 11, 12 and 14 are convenient for ease of growth and operation of the device. Typically, layer 11 ranges from about 1 to 2 μm, layer 12 ranges from about 2 to 3 μm and layer 14 ranges from about 1 to 3 μm.

On the other hand, the thickness of layer 13 should be sufficient to provide the device with a high emitter injection efficiency, with values of at least about 0.99, which implies a high current gain. The thinner the layer, the higher the gain. Accordingly, layer 13 ranges from about 0.2 to 0.5 μm. Layers below about 0.2 μm are difficult to grow uniformly and may lead to punch-through or discontinuous islands, while layers greater than about 0.5 μm result in an unacceptable drop in amplification gain.

Bipolar junction transistor 18 comprises layers 12, 13 and 14, with collector contact 15 being made to the backside of the substrate. Base contact 16 is made to an exposed portion of layer 13, while emitter contact 17 is made to the exposed surface of layer 14. The emitter, base and collector contacts comprise conventional electrical contacts, making ohmic contact to the respective semiconductor surface. In the case of GaAs/(Al,Ga)As, ohmic contacts such as Au-Ge are suitably employed for n-type material and Au-Zn for p-type material. The contacts are formed employing well-known processes.

A light-emitting device 19 comprises layer 11 and 12 forming a p-n junction. The light emitting device must, of course, be direct bandgap in the light-emitting region in oder to emit light. The device may be a light emitting diode (LED) or heterostructure junction diode laser.

The diode laser (not shown) alternatively employed as a light-emitting device in place of LED 19 comprises an additional layer of p-type $Al_xGa_{1-x}As$, where x=0.6, having a carrier concentration of about $1 \times 10^{17}$ cm$^{-3}$ between the substrate 10 and layer 11, together with an additional layer of n-type $Al_xGa_{1-x}As$, where x=0.6, having a carrier concentration of about $1 \times 10^{17}$ cm$^{-3}$ between layers 12 and 13. Both additional layers have a noncritical thickness of about 1 μm.

While the device in FIG. 1 is depicted as being formed on a p-type substrate, complementary devices may also be fabricated in accordance with the invention, making appropriate substitutions of n-type for p-type and vice versa.

FIG. 2 depicts the equivalent circuit of FIG. 1, showing the relationship of the bipolar transistor 18, in common emitter configuration, and LED 19. An electrical signal to be amplified is introduced into the base contact with respect to the grounded emitter. The collector contact is connected to a small DC power supply identified as $V_{CC}$, with typical voltage values of up to 20 V. The current on the base $i_B$ is amplified by an amount $\beta$ (current gain); the product of $\beta$ and $i_B$ is approximately equal to the current on the collector $i_C$. The amplified collector current $i_C$ drives the LED, with light output 20 proportional to drive current. The higher the collector current, the higher the light output in milliwatts.

By reducing the thickness of layer 13 and interface defects at the interface between layers 13 and 14, gains as high as 2,000 to 2,500 are easily achievable with the device of the invention. (These high gains arise due to the high emitter injection efficiency across the heterointerface.) Further, devices of the invention may be cascaded, thereby obtaining quite high gains.

In the case of $\beta=2,000$ for a typical base current of $i_B=1$ $\mu$A (corresponding to a 1 $\mu$V signal across a 1 ohm load), the transistor produces an amplified collector current of $i_C=2$ mA, which forward-biases the LED. If the GaAs LED is assumed to have a 5% quantum efficiency and capable of emitting radiation 20 at 0.93 $\mu$m, a power output of 0.05 to 0.1 mW is obtained at drive currents of 2 mA. This corresponds to a transfer power gain of about 40 to 50 dBm at frequencies of several hundred MHz. By driving the transistor at higher base currents, the power output can be further increased correspondingly. For fiber optic applications, this power output of 0.1 mW compares favorably with the present capabilities of over 3 mW for high radiance LEDs at drive currents of over 5,000 A/cm$^2$. Two possible configurations for light coupling into a fiber optic waveguide are shown in FIGS. 3 and 4, with appropriate numbers employed to represent like elements as in FIGS. 1 and 2.

Figure 3:
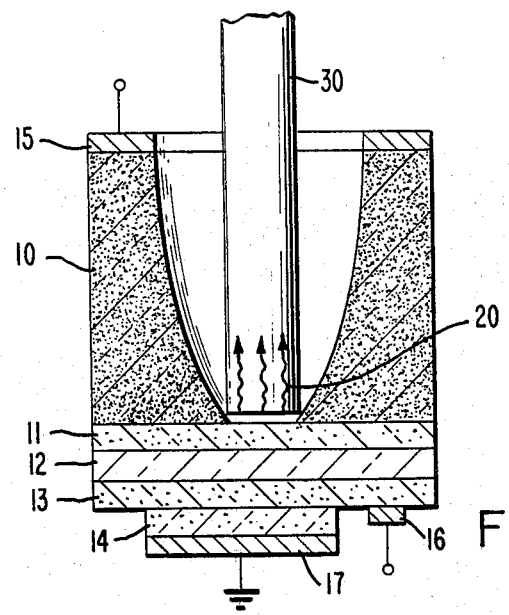
FIG. 3 is a cross-sectional view of one embodiment employing the device of the invention.
Figure 4:
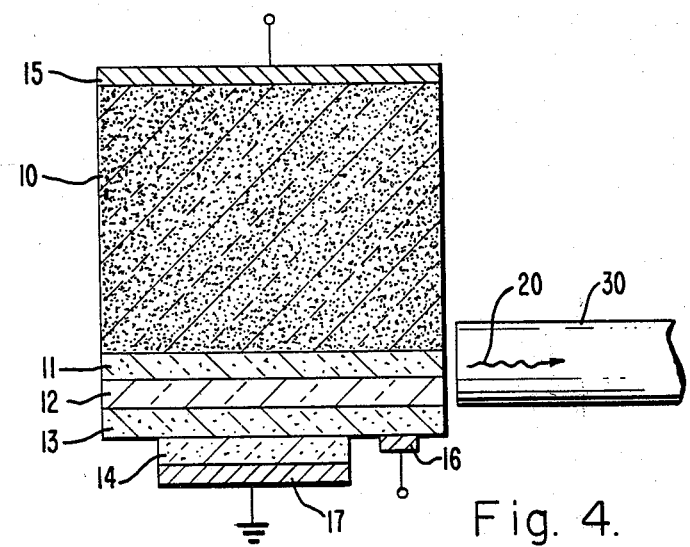
FIG. 4 is a cross-sectional view of a second embodiment employing the device of the invention.

FIG. 3 is the conventional Burrus configuration allowing low loss coupling into fiber optic waveguide 30. FIG. 4 depicts an edge-emitting structure permitting higher outputs. The fiber optic waveguide is maintained in position by support means (not shown).

Figure 5:
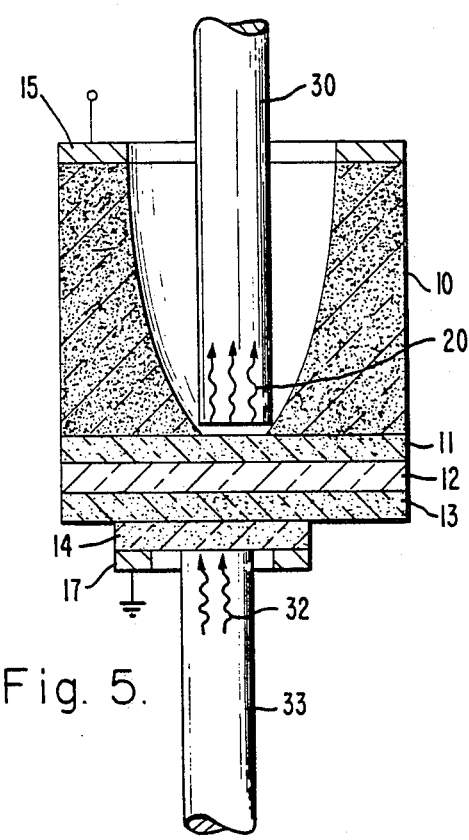
FIG. 5 is a cross-sectional view depicting use of an alternative embodiment of the invention.
Figure 6:
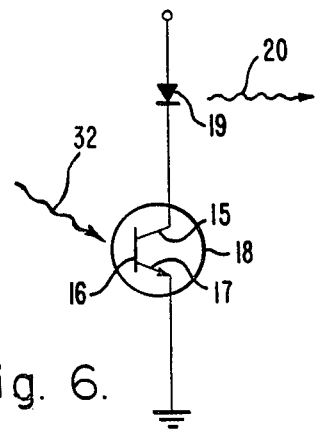
FIG. 6 is an equivalent circuit of FIG. 5.

In an alternate embodiment, optical radiation, instead of an electrical signal, may be directly amplified. As depicted in FIGS. 5 and 6, optical radiation 32 is introduced into the emitter 17 (layer 14) by optical waveguide 33, is amplified and is emitted through optical fiber waveguide 30 in, for example, a conventional Burrus structure. In this configuration, ohmic contact to the base 16 (layer 13) of the transistor is not necessary, and the base 16 (layer 13) is left floating. An edge-emitting structure, corresponding to FIG. 4, may alternatively be employed. The equivalent circuit is depicted in FIG. 6.

The operation of the device of this alternate embodiment is as follows. Optical radiation (1.3 eV, 0.8 $\mu$m) penetrates the emitter 17 (layer 14) (bandgap 2.2 eV), which is transparent to light at this wavelength. The light is absorbed in the base 16 (layer 13) and creates a photocurrent which is then amplified as a result of transistor action. This amplified collector current then forward-biases the LED, consequently providing an amplified light output.

While a specific structure and alternative embodiments have been depicted herein, other structures may be suitably employed in constructing the device of the invention. Similarly, the process disclosed herein is intended to be exemplary only; modifications may be made in the process steps and in the order of the steps without departing from the spirit and scope of the invention.

What is claimed is:

1. A process for fabricating an amplifier for amplifying optical radiation which comprises:
    (a) providing a highly doped substrate of a compound semiconductor material having a first conductivity;
    (b) forming on at least a portion of said substrate a first epitaxial layer of a compound semiconductor material having the same conductivity as said substrate;
    (c) forming on at least a portion of said first layer a second epitaxial layer of a compound semiconductor material having a conductivity opposite to that of said first layer and being essentially undoped;
    (d) forming on at least a portion of said second layer a third epitaxial layer of a compound semiconductor material having a conductivity the same as said first layer, said third layer having a thickness sufficient to provide the amplifier with a high emitter injection efficiency;
    (e) forming on a portion of said third layer a fourth epitaxial layer of a mixed compound semiconductor having a conductivity the same as said second layer;
    (f) forming an ohmic contact to said fourth layer; and
    (g) forming an ohmic contact to said substrate.

2. The process of claim 1 further comprising forming an ohmic contact to said third layer.

3. The process of claim 1 further comprising forming an epitaxial layer of a mixed compound semiconductor material between said substrate and said first layer, having the same conductivity as said substrate and said first layer, and forming an epitaxial layer of a mixed compound semiconductor material between said second layer and said third layer, having the same conductivity as said second layer.

4. The process of claim 1 in which said compound semiconductor material and said mixed compound semiconductor material are selected from the class of III-V semiconductor materials.

5. The process of claim 4 in which the difference between the bandgap of said mixed compound semiconductor material and that of said compound semiconductor material is at least about 0.5 eV.

6. The process of claim 4 in which said compound semiconductor material comprises GaAs and said mixed compound semiconductor material comprises (Al,Ga)As.

7. The process of claim 6 which comprises:
    (a) providing a highly doped substrate of p-type GaAs, doped to greater than about $10^{18}$ cm$^{-3}$;
    (b) forming on at least a portion of said substrate a first epitaxial layer of p-type GaAs, said layer of p-type GaAs having a carrier concentration of about $1 \times 10^{17}$ cm$^{-3}$;
    (c) forming on at least a portion of said first layer a second epitaxial layer of a material selected from the group consisting of n-type GaAs and n-type $Al_xGa_{1-x}As$, where x ranges from about 0.6 to 0.9;
    (d) forming on at least a portion of said second layer a third epitaxial layer of p-type GaAs having a carrier concentration of about $1 \times 10^{18}$ cm$^{-3}$ and a thickness ranging from about 0.2 to 0.5 $\mu$m;
    (e) forming on a portion of said third layer a fourth epitaxial layer of n-type $Al_yGa_{1-y}As$ having a carrier concentration of about $1\times 10^{17}$ cm$^{-3}$ and a value of y ranging from about 0.3 to 0.9;

(f) forming an ohmic contact to said fourth layer; and (g) forming an ohmic contact to said substrate.

8. The process of claim 7 further comprising forming an ohmic contact to said third layer.

9. The process of claim 7 further comprising forming between said substrate and said first layer an epitaxial layer of p-type Al$_x$Ga$_{1-x}$As, where x is about 0.6, having a carrier concentration of about $1\times 10^{17}$ cm$^{-3}$ and forming between said second layer and said third layer an epitaxial layer of n-type Al$_x$Ga$_{1-x}$As, where x is about 0.6, having a carrier concentration of about $1\times 10^{17}$ cm$^{-3}$.

* * * * *